United States Patent
Hirayama

Patent Number: 6,103,391
Date of Patent: Aug. 15, 2000

[54] TITANIUM PRODUCT WITH MEGA-CRYSTAL GRAINS SEPARATED NEAR THE SURFACE AND ITS MANUFACTURE

[76] Inventor: Ryuta Hirayama, 2-43, Uwa-machi, Yokosuka, Kanagawa 238-0017, Japan

[21] Appl. No.: 09/160,838

[22] Filed: Sep. 25, 1998

[30] Foreign Application Priority Data

Sep. 25, 1997 [JP] Japan ..................... 9-276689

[51] Int. Cl.⁷ .............. B32B 15/01; C22C 14/00
[52] U.S. Cl. ............. 428/544; 30/350; 148/518; 148/421; 428/660; 428/913.3
[58] Field of Search ................... 148/421, 518; 428/660, 913.3, 544; 30/350; 420/417

[56] References Cited

U.S. PATENT DOCUMENTS 5,215,606  6/1993  Tsukamoto ............... 148/518
5,394,420  2/1995  Senn et al. ............... 372/39

FOREIGN PATENT DOCUMENTS 49-99933  9/1974  Japan.
63-60266  3/1988  Japan.
7-108370  4/1995  Japan.

OTHER PUBLICATIONS

Morton C. Smith, Principless of Physical Metallurgy, Harper and Bros. Publishing, pp. 232–243, 1956.

*Primary Examiner*—Deborah Jones
*Assistant Examiner*—Robert R. Koehler
*Attorney, Agent, or Firm*—Jones & Askew LLP

[57] ABSTRACT

The present invention seeks to provide a titanium product applicable to construction material, daily necessities, cutlery and a trowel which has an excellent decorative effect or an excellent smoothing ability in smoothing the kneaded material surface and a manufacture method thereof. The titanium product according to the present invention has crystal grains including twins of 100 $\mu$m or larger separated on or near a partial or the entire surface.

11 Claims, 2 Drawing Sheets

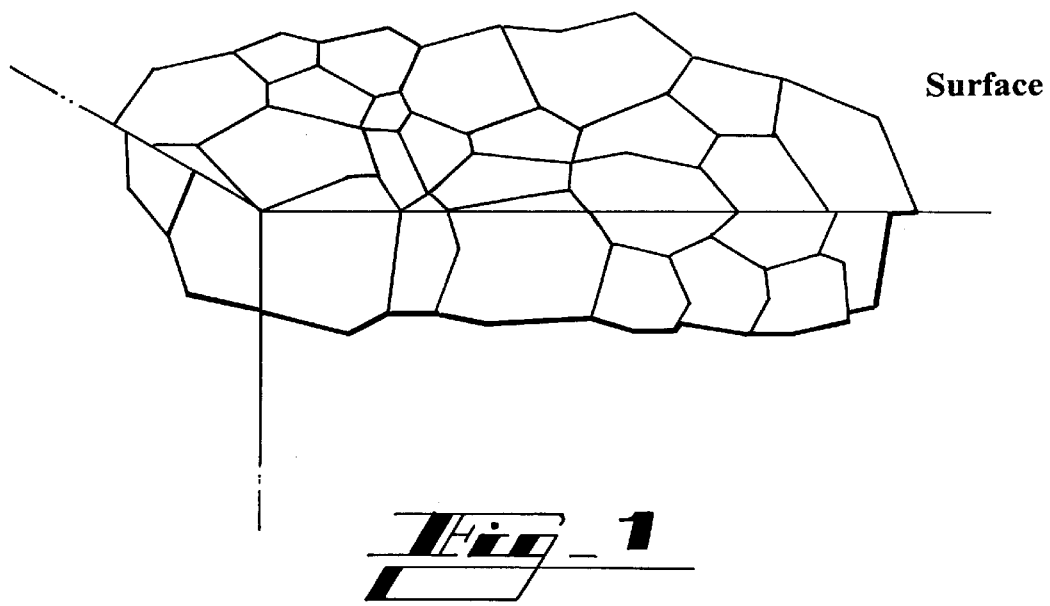
Fig_1
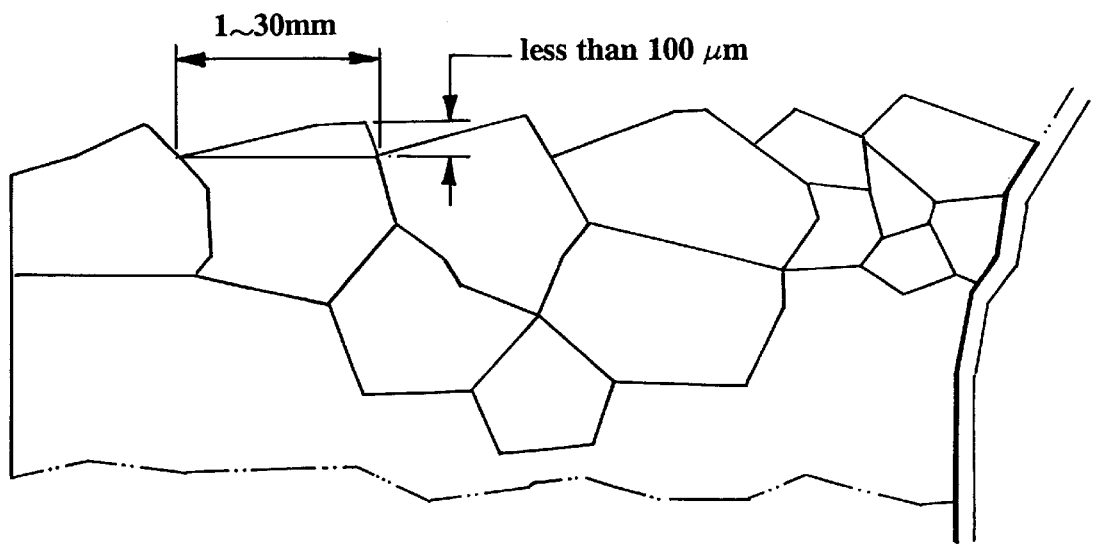
Fig_2

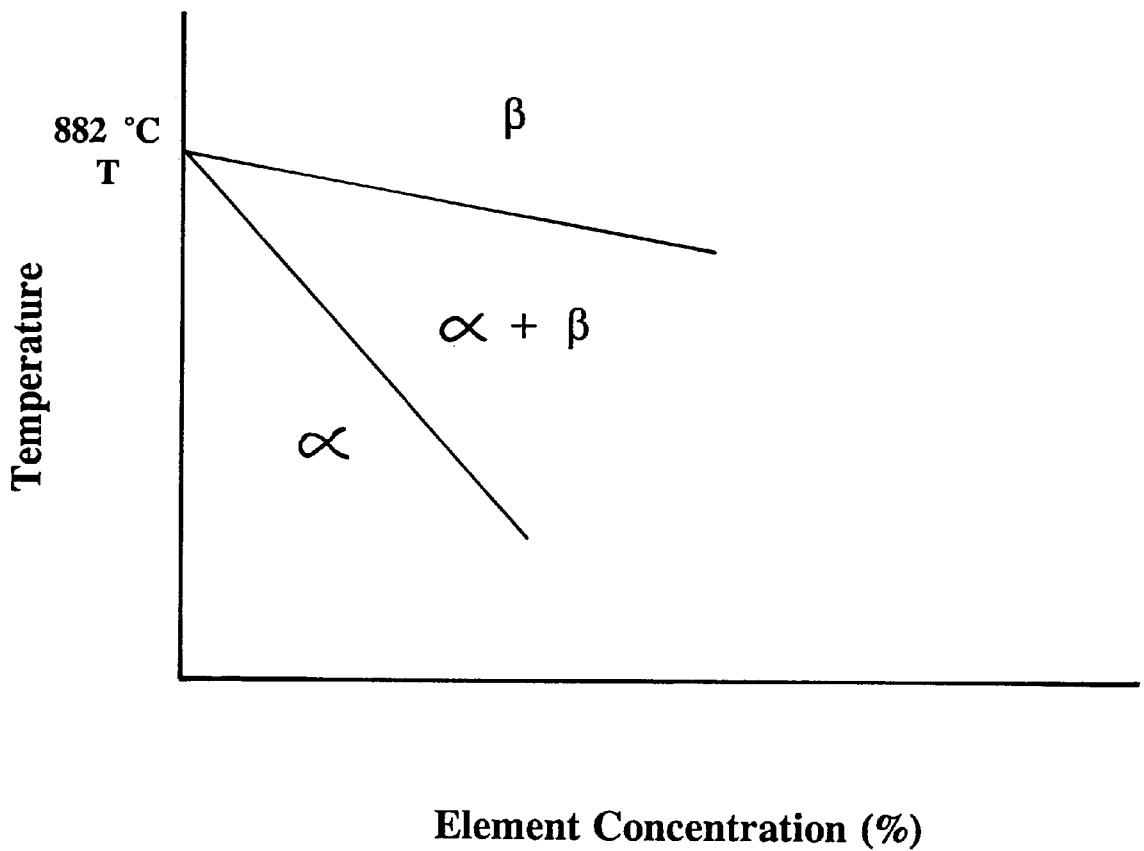
Fig_3

TITANIUM PRODUCT WITH MEGA-CRYSTAL GRAINS SEPARATED NEAR THE SURFACE AND ITS MANUFACTURE

FIELD OF THE INVENTION

This invention relates to a titanium product (including a titanium alloy product hereafter) which is excellent in a decorative effect because of very small roughness or in smoothing kneaded surface and manufacture thereof.

DESCRIPTION OF THE RELATED ART

Since the ancient time, in Japan and the Middle and Near East, visible fine crystalline grains have been utilized to provide a sword with a decorative effect by forging and heat treatment. In Japan, visualized crystal (or crystalline) grains, which may be called "nie", "nioi", have been appreciated in a Japanese sword. In the Middle and Near East, a sword with a wonderful wave form pattern made during a forging process, which may be called Damascus sword, has been appreciated. In those days, crystalline grains were visualized to give the sword mechanical strength resulting in giving an excellent decorative effect.

In the prior art, Tokukai No. sho 49-99933 (published Japanese application) discloses a decorative metallic craft article partially or entirely with a large crystalline pattern on the surface and the same plated, deposited, sprayed or color-painted.

Although the patent application discloses 75-35 copper-zinc alloy for a metal or metal alloy sample, it does not disclose any other metal or metal alloy, or does not teach a titanium or titanium alloy application.

Tokukai No. Sho 63-60266 (published Japanese patent application) discloses a platinum craft article having a mosaic style of reflected blue light pattern on the surface, which is made of shaped material in a certain form heat treated at 1500–1700 degree C.

Although the patent application discloses the platinum craft article having a pattern on the surface by heat treatment, it does not disclose any titanium or titanium alloy product having large crystal grains on the surface at all.

Tokukai No. Hei 7-108370 (published Japanese patent application) discloses an aluminum or aluminum alloy compound, which has inorganic fibers like carbon fibers and a Ti—Al intermetallic compound in a disperse phase, having dotted patterns on the surface like granite.

Although the patent application discloses an aluminum or aluminum alloy compound, it dose not disclose anything about any titanium or titanium alloy or does not teach to make a pattern on the surface without any disperse phase.

Although it is known that a so-called "matte finish" pattern is made by forging or heat treatment among those in the titanium manufacturer, a variety of patterns may be made depending on a material treatment history and has not been utilized.

In spite of low density (or lightweight) and corrosion resistance, titanium or titanium alloy has not been used for tools to smooth kneaded material surface such as a plaster, a trowel and a spatula for confectionary use.

PURPOSE OF THE INVENTION

The purpose of this invention is to supply a titanium product, which is excellent in a decorative effect and in smoothing kneaded surface, such as daily necessities, building material, a cutlet and trowel and a manufacture thereof.

SUMMARY OF THE INVENTION

The present invention seeks to achieve the above-mentioned purpose to provide an excellent decorative titanium or titanium alloy product, which has crystal grains including twins of approximately 100 µm or larger, more preferably approximately 1 mm or larger, precipitated or separated near the surface. The products may also have oxide film, clear lacquer or the like on the surfaces if there is necessity, e.g. necessity to prevent finger marks and to provide an anti-bacterial function by photo catalyst.

For the above-mentioned purpose, the present invention provides a titanium or titanium alloy tool (e.g., a trowel and a spatula for confectionary use) which has crystal grains on the functional surface including twins of approximately 100 µm or larger so as to provide very fine roughness on the surfaces to make kneaded material smooth (see FIGS. 1 and 2). It is not clearly understood, but it is inferred that the fine roughness may be made of exposed grain boundaries that are distorted because of a boundary condition of the surface since cross-sections are pentagonal in the bulk.

And to attain the above-mentioned purpose, the present invention provides a method for making a titanium or titanium alloy product, which comprises the steps of:

cutting, polishing and rust-removing, if necessary, material of sheet, square lumber and bar, or shaped intermediate product by forging or rolling, or further machined daily necessities, building material, smoothing tool for kneaded surface, cutlery and forged material;

degreasing and removing surface oxides or machined surface the material processed in the previous step if necessary;

heating the material processed in the previous step in a vacuum or in an inert gas at 900–1500 degree C for more than 1 hour so as to separate crystal grains including twins of 100 µm or larger on the surface partially or entirely.

The present invention will be described in detail.
According to the present invention, titanium categorized in chemical composition Class 1–4 of JIS H4600 and titanium alloy such as 4AL-4V—Ti, 8al-1Mo-1V—Ti, 5 Al- 2.5Sn—Ti, 6Al-6V-2Sn—Ti may be used.

The size of crystal grains need to be approximately 100 µm or larger so that they may be visible with naked eyes. This is because it is hard to recognize grain boundaries and twins if the size is smaller. There is no specific upper limit in the size. The size can be more than several millimeters. However, it is not necessarily realistic to make grain size infinity. Typical large grain size may be approximately 30 mm.

The titanium product in accordance with the present invention may be daily necessities such as silverware, a cooking tool and kitchenware, building material used for a veranda, a gate door and a bathing room, goods requiring a decorative effect such as a toy, stamp material, a knife to cut a wedding cake, an ornament and a decoration, and a surfacing tool to smooth kneaded material surface such as a trowel and a spatula for confectionary use.

The starting material for the manufacturing method in accordance with the present invention may be a thin or thick plate, a square or round bar, round bars, pipes, expand mesh or punching mesh, an intermediate product processed from any one of them, processed any one of them by machining, electric discharge machining or forging, or cast and machined material.

In accordance with the present invention, to form crystal grains including twins of 100 µm or larger on the partial or entire surfaces of the titanium or titanium alloy product, it is necessary to heat the titanium or titanium alloy (product) at a temperature higher than the β-transformation point (882 degree C for pure titanium), more specifically, at a temperature of approximately 900–1500 degree C, usually approximately 900–1200 degree C (FIG. 3). The heat treatment period differs depending on the type of pure titanium or titanium alloy and the extent of processing before heating, but it is usually one hour or longer. During this heating process, as the titanium or titanium alloy easily get oxidized, they must be heated in a vacuum or in an inert gas.

In accordance with the present invention, a heating rate up to 900–1500 degree C and a cooling rate down from 900–1500 degree C are important. The heating rate is preferably 2–5 degree C/minute, while the cooling rate is preferably 2 or less than 2 degree C/minute.

This is because cooling too rapidly may cause too small crystals. To take out the product at a high temperature my cause its surface to be covered with thick oxide films, so it is necessary to take them out after they have been cooled at lower temperature to avoid surface oxidation, typically 200 degree C or a normal temperature.

A heating apparatus, which can control the ambient environment, may be employed in the method according to the present invention. An electric furnace is preferable since it is easy to control the ambient environment. An electrode of the electric furnace may be an platinum electrode because it is easy to control the temperature. However, other electrodes like an carbon electrode may also be used. But the electric furnace must be capable of keeping itself at a constant temperature and controlling temperature increase and decrease very accurately.

In accordance with the present invention, since titanium or titanium alloy is covered with an oxide layer, it is necessary to remove the oxide layer before heat treatment so as to provide desired seed crystals. Especially if excellent appearance is essential, it is necessary to remove a processed or machined layer before heat treatment so as to provide desired seed crystals. To remove the oxide film or the processed layer, strong acids like sulfuric acid, hydrochloric acid, fluo acid, or strong alkali like sodium hydroxide and the like may be used.

Mechanism

According to the present invention, since the titanium product has crystal grains including twins of 100 μm or larger separated on or near the surface, each crystal grain is oriented in the normal direction of the surface with a slight angle fluctuation, causing sparkling (light reflection) on each crystal grain depending on the angle of observation. Since twins are formed on the crystal surface, stripe patterns are formed and grain boundaries provides an appearance of mesh-like patterns. This means that daily necessities, building materials, accessories and the like which have crystal grains including twins of 100 μm or larger on a partial or the entire surface may be appreciated as a highly decorative product.

Since the product having crystal grains including twins of 100 μm or larger on the surfaces has very small roughness on the surface (see FIGS. 1 and 2), which is unavailable by mechanical processing, the surface is easily detached from kneaded material if the product is applied to a trowel or a spatulas for confectionary use. Thus, the product appropriately applies a trowel, a spatula for confectionary use and a spatulas for kneaded material.

BRIEF DESCRIPTION OF DRAWINGS

FIG. 1 is a diagrammatic perspective view of a part of a titanium alloy product of the present invention.

FIG. 2 is a diagrammatic cross-sectional view of a part of a titanium alloy product of the present invention.

FIG. 3 is a phase diagram of titanium or titanium alloy.

DESCRIPTION OF THE PREFERRED EMBODIMENT

The present invention will be explained referring to several examples in accordance with the present invention.

EXAMPLE 1

A titanium disk with a diameter of 20 mm is punched out from a 2-mm thick titanium sheet of JIS Class 1 (JIS H 4600 Chemical Composition Class 1, H: 0.013% or less, O: 0.15% or less, N: 0.05% or less, Fe: 0.20% or less, Rest: Ti). A hole of 1-mm diameter was made in the disk as a breast accessory for a suspending thread where the processed titanium is called "processed material" hereafter. The processed material was cleaned in acetone with an ultrasonic cleaning machine to remove pollutants such as mechanical oil on the surface and was soaked for 30 minutes in boiled 35% of diluted hydrochloric acid to remove an oxide layer and a mechanically processed layer near the surface. Then, this processed material was washed with distilled water and was dried in an electric oven at 120 degree C.

Next, the washed processed material was suspended by a titanium thin wire through the hole in a vacuum furnace. After the furnace chamber was evacuated, the processed material was heated in the furnace at a rate of 5 degree C/minute up to 1200 degree C and the temperature was kept constant for 5 hours. Then, it was cooled to 500 degree C at a cooling rate of 2 degree C/minute, then the heater was turned off leaving the temperature cooling down. After cooling down to a room temperature, air was introduced into the vacuum chamber to remove the processed material from the chamber. Crystal grains including twins with an average diameter of 3 mm were formed on the surface of the processed material. The processed material was sparkling so that it could be used as a breast accessory as it was. After it was anodically oxidized at 10V in a phosphoric acid solution with a platinum cathode, clear lacquer was applied to the surface to prevent stain by dirt from hands.

EXAMPLE 2

A titanium panel of 50 mm wide and 200 mm long for a presumed building material was cut out from a 2-mm thick titanium sheet of JIS Class 2 (JIS H 4600 Chemical Composition Class 2, H: 0.013% or less, O: 0.20% or less, N: 0.05% or less, Fe: 0.25% or less, rest: Ti). After the titanium panel was degreased in a strong alkali solution of NaOH, it was soaked in a mixed solution of hydrofluoric acid and nitric acid for 25 minutes to remove the oxide layer and the mechanically processed layer on the surface. After this processed material was washed with distilled water, it was dried in an electric oven at 120 degree C.

Next, this processed material was put in a vacuum furnace, which was evacuated, and was heated at a rate of 5 degree C/minute up to 1200 degree C. The temperature was kept constant for 7 hours. Then, it was cooled to 500 degree C at a rate of 2 degree C/minute and the heater was turned off leaving the furnace cooling down. After cooling down to the room temperature, air was introduced into the vacuum furnace and the processed material was taken out. On the surface of the processed material, crystal grains including twins whose average diameter is 5 mm were formed.

After the processed material was anodically oxidized at 10V in a phosphoric acid solution, the presumed building material was made of the processed material by heating for one hour in an open air atmosphere of 300 degree C.

As the building material has very small roughness as well as a beautiful crystal pattern, it may effectively prevent sliding. As it is covered with titanium dioxide, which may cause a photo catalytic effect, it is effectively antibacterial. Thus, it may be most suitable for a tile used in a bathroom and for a cooking table.

EXAMPLE 3

A stamp (or seal) material 70 mm in length ("processed material" hereafter) was made by cutting a 20-mm diameter round bar of titanium (JIS Class 1). In the same manner as in Example 1, after this processed material was cleaned in acetone with an ultrasonic cleaner to remove mechanical oil and other stain on the surface, the oxide layer and the mechanically processed layer on the surface were removed by soaking it in a mixed solution of hydrofluoric acid and nitric acid for 30 minutes. After this processed product was washed with distilled water, it was dried in an electric oven at 120 degree C.

Next, this processed material was set in a vacuum furnace. After the vacuum furnace was evacuated, it was heated at a rate of 5 degree C/minute up to 1200 degree C and then the temperature was kept constant for 2 hours. Then, it was cooled down to 500 degree C at a rate of 2 degree C/minute and the heater was turned off leaving the furnace cooling down itself. After it cooled down to the room temperature, air was introduced into the vacuum furnace to take out the processed material. On the surface of this processed material, crystal grains including twins whose average diameter is 1 mm were formed.

Then, the processed stamp material was mechanically polished so that a person's family name may be engraved by an electric discharging process on the seal face of the processed stamp material. The stamp material is good in the appearance and in the touch because of very small roughness by fine crystal grains.

Further, when a stamp is generally engraved with a computer, the engraved feature is usually exactly the same. However, if the processed stamp material of the present invention is engraved, the feature of each stamp may vary slightly. Thus, it is OK to engrave a stamp with a computer on the processed stamp material for the seal (stamp) registration.

EXAMPLE 4

A 2-mm thick titanium sheet of JIS Class 1 was shaped into a trowel shape with both mechanical processor and electric discharge processor. The shaped material ("processed material" hereafter) was further ground and polished on the trowel face with 1 $\mu$m diameter of aluminum oxide powders. The processed material was cleaned in acetone with an ultrasonic cleaner to remove machine oil and other stain on the surface. Then, the processed material was soaked in a mixed solution of hydrofluoric acid and nitric acid for 30 minutes to remove the oxide layer and the mechanically processed layer on the surface. After the processed material was washed with distilled water, it was dried in an electric oven at 120 degree C.

The processed material was placed in a vacuum furnace. After the vacuum furnace was evacuated, it was heated at a rate of 5 degree C/minute up to 1200 degree C and kept at the constant temperature for 10 hours. Then, it was cooled down to 500 degree C at a rate of 2 degree C/minute and the heater was turned off leaving the furnace cooling down. After it cooled down to the room temperature, air was introduced into the vacuum furnace to take out the processed material. On the surface of this processed product, crystal grains of 5–10 mm diameter were formed. Each crystal face is oriented with a slight angle fluctuation and the crystal grains lined up continuously on the surface and the average depth of the roughness was 10 $\mu$m.

A trowel was made from the processed material by attaching a handle. When plaster applied to a wall was smoothed with the trowel, it was easy to detach the trowel from the plaster surface so as to obtain a desired smooth surface probably because the fine surface roughness of the trowel facilitated air ingress between the surfaces of the trowel and the plaster.

EXAMPLE 5

A 2-mm thick titanium sheet of JIS Class 1 was machined to form a knife shape of a wedding-cake-cutting knife. The shaped material ("processed material" hereafter) was ground on a portion for a blade. After the processed material was cleaned in acetone with an ultrasonic cleaner to remove machine oil and other stain on the surface, it was soaked in a mixed solution of hydrofluoric acid and nitric acid for 30 minutes to remove the oxide layer and the mechanically processed layer on the surface. This processed material was washed with distilled water and was dried in an electric oven at 120 degree C.

Next, the processed material was placed in a vacuum furnace and was heated at a heating rate of 5 degree C/minute up to 1200 degree C. After it was kept at the constant temperature for 5 hours, it was cooled down at a cooling rate of 2 degree C/minute to 500 degree C. Then, the heater was turned off leaving the furnace cooling down. After it cooled down to the room temperature, air was introduced into the vacuum furnace to take out the processed material. On the surface of this processed material, crystal grains including twins whose average diameter was 5 mm were formed. Thus, the entire surface of the knife sparkles so that it may be very suitable for a wedding cake cutting knife.

Although no coloring during a post-process such as etching, coating anodic oxidation is mentioned in any example described above, it is also applicable to the present invention.

Further, in order to strengthen the effect of photo catalyst, it is possible to coat a catalyst mainly composed of titanium dioxide onto the processed material.

Even though this invention is concerning titanium or titanium alloy, the present invention may apply tantalum, zirconium, vanadium and their alloys.

Effect of the Invention

According to the present invention the following excellent effects may be caused.

(1) An excellent decorative product ever so far is provided since crystal grains including twins whose diameters are 100 $\mu$m or larger are separated on a partial or the entire surface of the titanium or titanium alloy product in accordance with the present invention.

(2) A smoothing tool for kneaded material such as a towel for a plasterer and a spatula for confectionary use is provided to have a better detachability than ever according to the present invention since the surface has very small roughness due to separated crystal grains including twins whose diameters are 100 $\mu$m or larger.

(3) In accordance with the present invention, a product has a preventive function from contamination and an antibacterial function since the surface is covered with titanium dioxide to produce active oxygen resolved from water deposited on the surface while the ultraviolet light is radiated.

(4) In accordance with the present invention, a product may ever be applicable to somewhere slippery since the product has very small roughness on the surface which has never been provided in the conventional method such as machine processing.

What is claimed is:

1. A titanium product comprising a crystal grain which includes twins, a size of said crystal grain being approximately 100 μm or larger, said twins being separated near a product surface thereof.

2. The titanium product of claim 1 wherein said surface is the entire surface of said product.

3. The titanium product of claim 1 further comprising one or more grain boundaries on the surface wherein said boundaries provide mesh patterns.

4. The titanium product of claim 1 further comprising stripe patterns caused by said twins separated on said surface.

5. The titanium product of claim 1 wherein said surface is treated by at least one process of transparent or semi-transparent film deposition, grinding, anodic oxidation, and clear lacquer coating.

6. The titanium product of claim 1 wherein said product comprises a decorative craft.

7. The titanium product of claim 1 wherein said product comprises material for a stamp.

8. The titanium product of claim 1 wherein said product comprises a trowel.

9. A titanium product comprising twins separated near its surface, said surface reflecting light specularly in random directions, wherein said twins is included in a crystal grain of approximately 100 μm or larger.

10. A method for manufacturing a titanium product comprising approximately 100 μm or larger twins, said twins separated near its surface, comprising the steps of:

processing titanium or titanium alloy material to form a product shape;

removing a mechanically processed layer on a surface of the formed material;

heating the formed material in a vacuum or in an inert gas at temperature higher than β-transformation point; and cooling said formed material at a rate of not exceeding 2 degree C per minute.

11. A method for manufacturing a titanium product comprising approximately 100 μm or larger twins, said twins separated near its surface, comprising the steps of:

processing titanium or titanium alloy material to form a product shape;

removing a mechanically processed layer on a surface of the formed material;

heating the formed material of said product in a vacuum or in an inert gas at temperature ranging from approximately 900 to 1500 degree C; and cooling said formed material at a rate of not exceeding 2 degree C per minute.

* * * * *